United States Patent [19]

Snyder

[11] Patent Number: 4,591,418
[45] Date of Patent: May 27, 1986

[54] MICROLAMINATED COATING
[75] Inventor: James R. Snyder, Milton, Wis.
[73] Assignee: The Parker Pen Company, Janesville, Wis.
[21] Appl. No.: 665,436
[22] Filed: Oct. 26, 1984
[51] Int. Cl.$^4$ .............................................. C23C 14/00
[52] U.S. Cl. ........................ 204/192 P; 204/192 SP; 204/192 C; 204/192 N; 427/250; 427/255.2; 427/255.7; 427/404; 427/419.7; 428/539.5; 428/688; 428/689; 428/697; 428/698
[58] Field of Search .......... 204/192 P, 192 SP, 192 C, 204/192 N, 192 R; 427/250, 255.2, 255.7, 404, 419.7; 428/539.5, 688, 689, 697, 698

[56] References Cited

U.S. PATENT DOCUMENTS

| 3,793,175 | 7/1974 | Joly et al. | 204/192 C |
| 4,101,200 | 7/1978 | Daxinger | 204/192 P |
| 4,226,082 | 10/1980 | Nishida | 204/192 N |
| 4,226,899 | 10/1980 | Thiel et al. | 427/250 |
| 4,252,862 | 2/1981 | Nishida | 428/457 |
| 4,309,460 | 1/1982 | Singh et al. | 427/250 |
| 4,403,014 | 9/1983 | Bergmann | 204/192 N |
| 4,415,421 | 11/1983 | Sasanoma | 204/192 N |
| 4,510,190 | 4/1985 | Gläser | 204/192 P |

FOREIGN PATENT DOCUMENTS

| 2077300A | 12/1981 | United Kingdom | 204/192 N |
| 2000812B | 7/1982 | United Kingdom | 204/192 N |
| 2093866A | 9/1982 | United Kingdom | 204/192 N |

Primary Examiner—R. L. Andrews
Attorney, Agent, or Firm—Edmond T. Patnaude

[57] ABSTRACT

An article is coated with alternate microscopically thin layers of titanium nitride and gold alloy using a cathodic sputtering process to provide a microlaminated coating having the color and brilliance of a much thicker coating of the gold alloy while being more resistant to corrosion and scratching.

21 Claims, 3 Drawing Figures

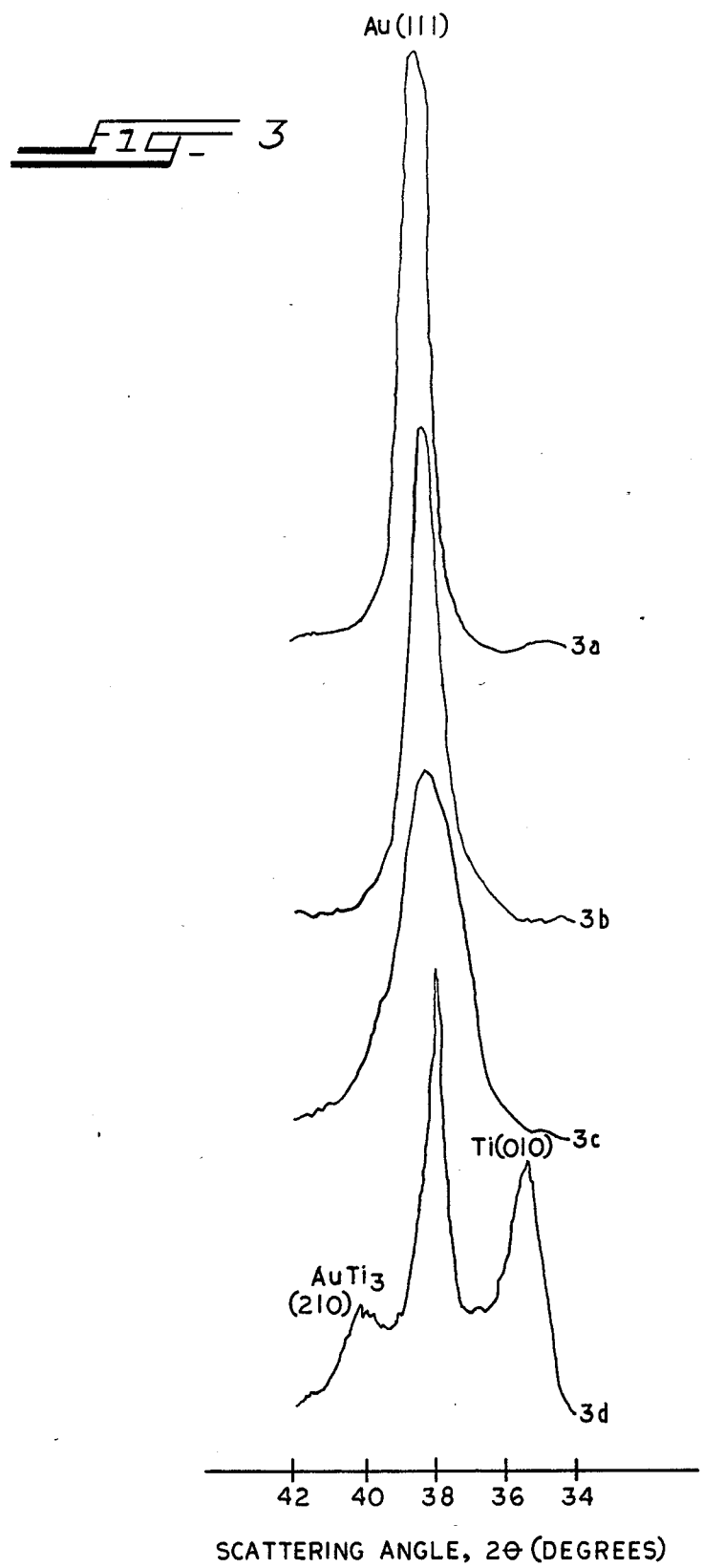

MICROLAMINATED COATING

The present invention relates in general to a process for coating parts with microlaminae of two different materials, and it relates in particular to an article having a microlaminated coating of a refractory metal nitride and a precious metal alloy and to a process for depositing the microlaminae by physical vapor deposition.

BACKGROUND OF THE INVENTION

It is known in the prior art that golden colored articles may be manufactured by depositing titanium in a nitrogen-containing atmosphere to form a layer of titanium nitride on a thermally resistant substrate. By controlling the amount of nitrogen available to react with the titanium, the color of the titanium nitride coating can be made to be similar to that of pure gold or of yellow gold alloys. However, due to the interaction of visible light at its surface, titanium nitride is much less brilliant than the gold or yellow alloys that it simulates. This well-known property of titanium nitride can be circumvented by the expedient of applying an additional coating of gold or a yellow gold alloy over the titanium nitride coating. U.S. Pat. No. 4,252,862 describes such a process. In this way, titanium nitride films have been used to increase the apparent wear life of decorative gold or gold alloy final coatings where they are substituted for or used atop the nickel underlayers whose use is well known in the electroplating art. Under conditions of continuous service in the hands of users, the relatively soft gold-containing layer scratches and develops a diffusely reflecting appearance and is simultaneously worn away, especially from exposed and prominent features of the coated substrate. When the gold-containing layer wears completely away from such prominences and the darker titanium nitride underlayer is exposed, the visual contrast thus produced is not as great as in the case where a nickel underlayer is exposed. But the fact that the gold-containing layer has worn away is not completely concealed since there still exists a visual contrast between the remaining brilliant and diffusely reflecting, scratched gold-containing regions that surround the darker and specular, scratch and wear resistant titanium nitride underlayer.

The films of the present invention avoid the inferior wear properties of gold or yellow gold alloys and the inferior appearance of titanium nitride. As a consequence of their structure, the films of the present invention integrate the superior appearance of gold or yellow gold alloys with the superior wear resistance of titanium nitride. When subjected to wear, the microlaminated films of the present invention retain their billiant and specular appearance and do not develop visually contrasting areas.

It is also known to simultaneously deposit titanium and gold or gold alloys in the presence of nitrogen. The codeposition approach produces films in which the constituent elements are mixed on an atomic scale and whose properties are uniform throughout their thicknesses. However, this atomic-scale mixing of elements does not result in the simple integration of the desirable properties of titanium nitride and gold. Rather, when gold or a gold alloy is codeposited with titanium in the presence of nitrogen in accordance with the prior art processes, films are produced whose properties are deficient in certain key areas: the mixed films possess a color which is substantially less yellow than either titanium nitride or the original gold or gold alloy; and the mixed films are less resistant to corrosion than either titanium nitride or the original gold or gold alloy As explained more fully hereinafter, these undesirable properties result from the presence of substantial amounts of gold-titanium intermetallic compounds which form during the growth of the codeposited films. In addition, these mixed films are less brilliant than the gold or gold alloy which is used to form them. It is also known to produce films in which there exists a continuous or stepwise gradient of composition from an underlayment of primarily titanium nitride to primarily gold or gold alloy at the free surface of the film. Films of this type necessarily have transition regions where, as a result of the atomic-scale mixing which promotes the interaction of gold and titanium, the desirable properties of the separate substances are degraded, as described hereinbefore.

For coated components which are subjected to conditions of wear and abrasion, all film regions are ultimately exposed as a free surface. The processes of wear decrease the quality of film structures which begin their service life with regions of inferior properties within the film.

It is a feature of the present invention that the formation of substantial quantities of gold-titanium intermetallic compounds is avoided and that the quality of components coated with these microlaminated but unmixed films is uniformly superior throughout their service life.

SUMMARY OF THE INVENTION

Briefly, in accordance with the teachings of a preferred embodiment of the present invention, microscopic, continuous or non-continuous respective microlaminae of gold or gold alloy and of titanium nitride are successively deposited on a thermally resistant substrate by cathodic magnetron sputtering or other physical vapor deposition processes. In this process a minimum of two independent sputtering targets are incorporated in a single vacuum chamber to deposit respectively the gold microlaminae and the titanium nitride microlaminae. The titanium target and the gold or gold alloy target are sufficiently isolated to avoid any substantial overlap of their respective coating fluxes. In this way the atomicscale mixing of their materials on the substrate surfaces is avoided and the reaction of gold with titanium is not promoted. In this embodiment distance serves to achieve the isolation of coating fluxes. Equivalently, the judicious placement of shields or a combination of both shields and physical separation could be employed to achieve the same end.

Each individual microlamina of either titanium nitride or gold is not necessarily continuous but may, depending on deposition conditions, be composed of partially connected islands of the coating material. In addition, each individual lamina of the present invention is not opaque. By depositing a sufficient number of microlaminae the substrate is completely occluded, and the resulting microlaminated coating has the desirable physical attributes of titanium nitride and gold or a gold alloy without the objectionable characteristics which result from the inter-reaction of gold and titanium. The brilliance of the microlaminated coatings is far closer to that of gold electroplated jewelry products and the like than are titanium nitride coatings or codeposited coatings of gold and titanium nitride.

Visual equivalence to gold electroplate is achieved in accordance with the present invention by sputter coating additional gold or gold alloy over the microlaminated titanium nitride and gold or gold alloy coating. The outer layer of gold or gold alloy gives the coated part the color and brilliance of electroplated gold, is as scratch resistant and durable as the multilaminated undercoating and is more scratch resistant and durable than is a conventional electroplated gold or gold alloy coating. The microlaminated coating is, of course, less expensive than the substantially thicker electroplated gold coating having the same visual appearance and wear performance because of the fact that the coating includes less gold.

GENERAL DESCRIPTION OF THE DRAWING

The present invention will be better understood by a reading of the following detailed description taken in connection with the accompanying drawing wherein:

FIG. 1 is a vertically sectioned, elevational view of a sputtering system which may be used in carrying out the process of the present invention, FIG. 2 is a horizontally sectioned view of the sputtering system shown in FIG. 1, and FIG. 3 is a plurality of curves representing partial X-ray diffraction patterns for four different films: curve 3a is the partial X-ray diffraction pattern of gold alloy film comprised of 1.67 weight percent nickel and 98.33 weight percent gold; curve 3b is the partial X-ray diffraction pattern of a microlaminated film according to the invention comprised of alternating microlaminae of titanium nitride and the gold alloy of curve 3a; curve 3c is the partial X-ray diffraction pattern of film comprised of the same elements as the microlaminated film of curve 3b when those elements are deposited in accordance with the prior art; curve 3d is the partial X-ray diffraction pattern of a film prepared like the film of curve 3c but without nitrogen.

DETAILED DESCRIPTION OF A PREFERRED EMBODIMENT OF THE INVENTION

Figure 1:
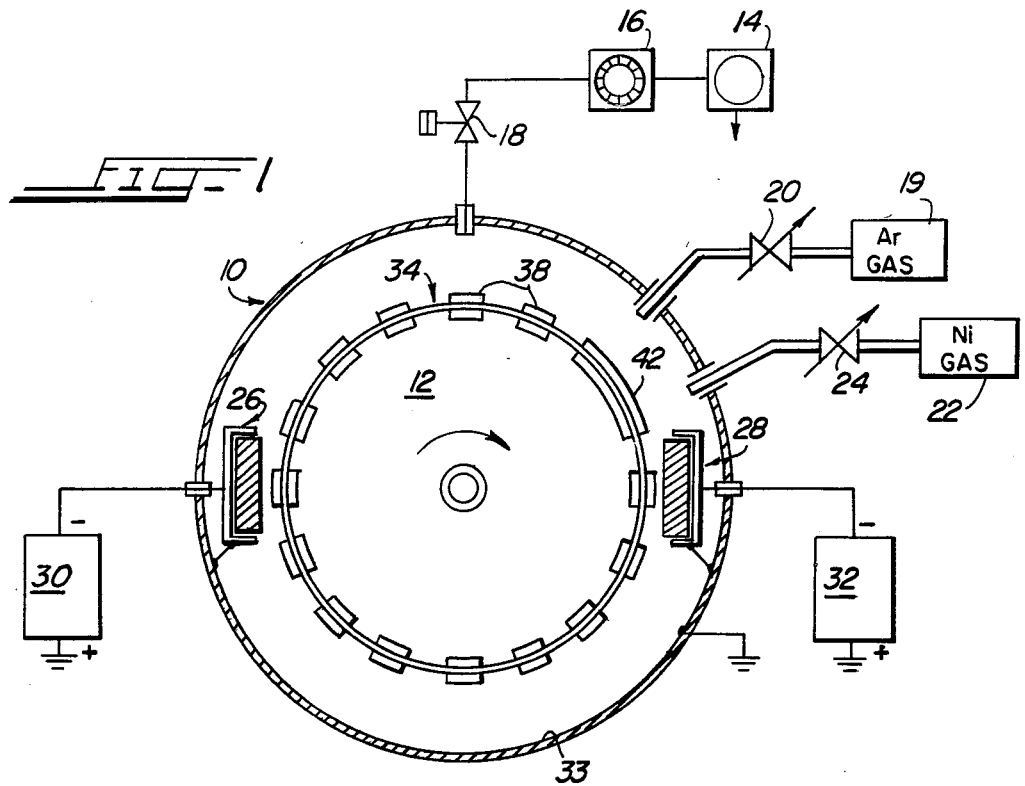
Figure 2:
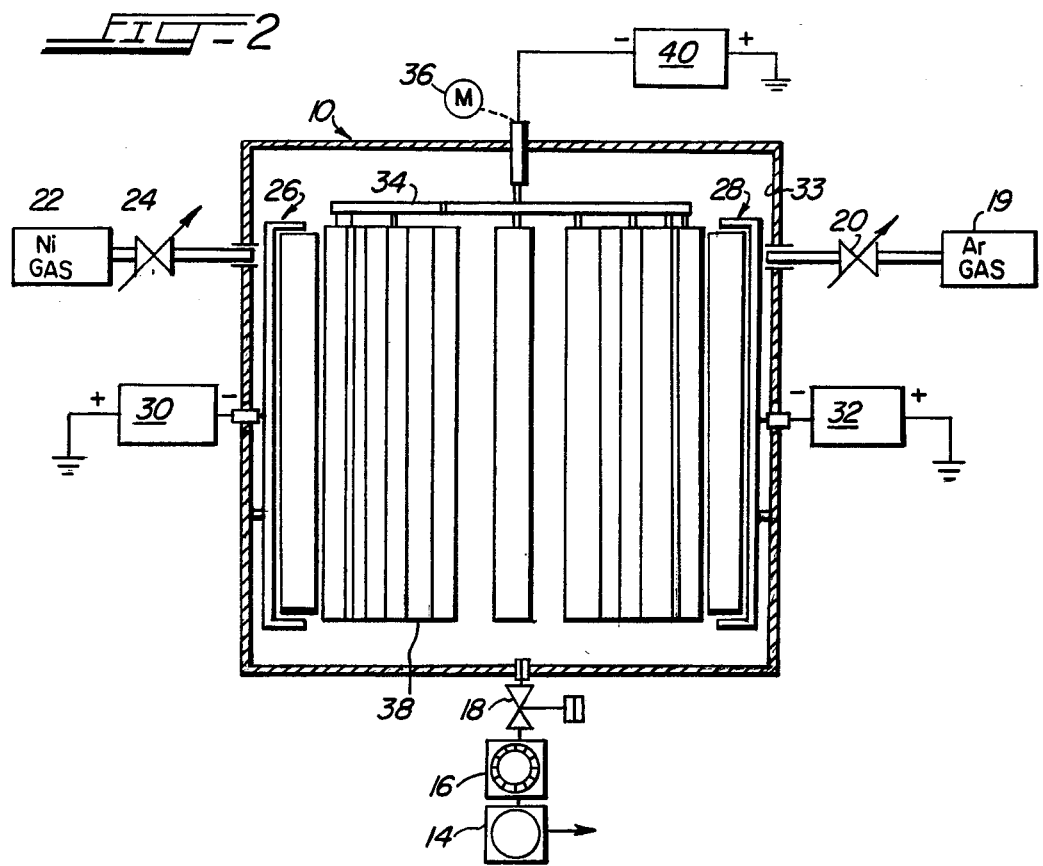

The present invention is particularly described herein in connection with the manufacture of gold coatings suitable for use on articles of jewelry, writing instruments or the like which must be resistant to wear and to corrosion from contact with the human body. However, in certain of its aspects the invention will find use wherever composite coatings of refractory metal compounds and precious metal alloys are desired but where interaction between the different metals is to be avoided.

Referring to the drawing, a generally cylindrical enclosure 10 contains a vacuum chamber 12 which is adapted to be evacuated by means of a set of pumps 14 and 16. The pumps are connected to the chamber 12 by a pneumatically operated gate valve 18. The pump 14 is a mechanical pump and the pump 16 is a turbomolecular pump.

A source of argon gas 19 is connected to the chamber 12 by an adjustable valve 20 for varying the rate of flow of argon into the chamber 12. In addition, a source of nitrogen gas 22 is connected to the chamber 12 by an adjustable valve 24 for varying the rate of flow of nitrogen into the chamber 12.

A pair of shielded, magnetron-type target assemblies 26 and 28 are physically mounted in spaced apart, diametric relationship in the chamber 12 and respectively connected to the negative outputs of a pair of variable D.C. power supplies 30 and 32. The wall 33 of the chamber 12 is conductive and, as shown, is electrically connected to ground as are the positive outputs of the power supplies 30 and 32. Consequently, the targets constitute cathodes and the chamber wall is an anode common to both the target cathodes. As is explained more fully hereinafter, separate glow discharges are established at the faces of the targets.

A substrate carrier 34 is suspended from the top of the chamber 10 and is rotated about its central vertical axis by a variable speed motor 36 to carry a plurality of substrates 38 past the targets 26 and 28. The carrier 34 is conductive and is electrically connected to the negative output of a variable D.C. power supply 40. The positive output of the power supply 40 is electrically connected to ground.

In addition to the substrates 38, an accurately shaped metal shutter 42 is carried by the substrate carrier for movement into proximity with the targets 26 and 28 for sputter-cleaning the targets.

As thus far described, it may be seen that two separate sputtering targets are provided within the same vacuum chamber 12, and these two targets are spaced apart by a sufficient distance that there is no significant overlapping of their respective coating fluxes.

In accordance with the present invention, the target 26 is formed of a non-precious, refractory metal such, for example, as titanium, zirconium, hafnium or tantalum. The target 28 is formed of a precious metal such, for example, as gold or a gold alloy. Metals suitable for alloying with precious metals to provide the material for the target 28 include Al, Si, Cr, Fe, Co., Ni, Cu, Zn, Ga, Ge, Y, Zr, Nb, Mo, Ru, Cd, In, Sn, Sb, and W. Suitable precious metals are Rh, Pd, Ag, Os, Ir, Pt and Au.

In order to provide a non-precious metal article or part with a coating whose appearance is equivalent to and whose performance is greater than that of an electrodeposited precious metal coating, in accordance with the present invention a thermally resistant substrate having the desired shape of the article or part is coated with a plurality of microlaminae of a nitride of a refractory metal respectively interspersed between a plurality of microlaminae of the precious metal or of an alloy of the precious metal. Each individual microlamina of the nitride has a thickness which is from 0.01 to 0.33 micrometers. Each individual microlamina of the precious metal or precious metal alloy has a thickness which is from 0.003 to 0.13 micrometers.

As microlamina thicknesses approach their respective lower limits, the sensitivity of film quality to the deposition conditions (e.g., substrate temperature, substrate bias potential) and to the materials' properties (e.g., diffusion rates, reaction kinetics) increases. This increased sensitivity serves to narrow the ranges of deposition parameters which produce films of acceptable quality.

It has also been observed that as the respective lower limits are exceeded, a trade off between desirable film properties appears: the amount of bias sputtering required to produce high purity, dense, non-columnar films also produces a degree of film disruption that promotes the formation of significant amounts of gold-titanium intermetallic compounds. As microlamina thicknesses are decreased further, the resulting film properties approach those of prior art films in which atomic-scale mixing is not avoided.

Microlaminae whose thicknesses are less than the stated respective upper limits are not opaque to visible light. The color and brilliance of a substrate coated with an opaque plurality of non-opaque microlaminae will lie between the colors and brilliances of the bulk microlamina materials.

The final color and brilliance of an article coated with an opaque plurality of non-opaque microlaminae will, in general, be closer to the color and brilliance of the material deposited last. However, the size of this effect is dependent upon how close the microlamina thicknesses are to their stated respective upper limits and upon their relative thicknesses, i.e., the average karatage of the film.

For decorative applications, the preferred final microlamina is gold or a yellow alloy thereof. In addition to the desirable color and brilliance such a final layer gives to a coated article, it also enchances the coated articles resistance to scratching and wear.

It is well known that extremely thin layers of soft, ductile materials improve the tribiological properties of harder materials upon which they are deposited. In such film systems, the effective hardness of the soft film increases exponentially with decreasing thickness. This phenomenon is thought to be the cause of the superior wear and scratch resistance of the films of the present invention.

Thus, the desirable properties of the two microlamina materials are preserved and furthermore complement one another in a synergistic manner.

As the stated respective upper limits of microlamina thicknesses are exceeded, the microlaminae become totally opaque to optical radiation. With increasing microlamina thicknesses, the tendency of the coated article to develop visual contrasts during its service life also increases. As the thickness of the gold-bearing microlamina increases, its effective hardness approaches the hardness of the bulk material and its tendency to develop a scratched, diffusely reflecting appearance increases proportionally.

In order that the invention may be more readily understood, it will now be described, by way of example only, with reference to the following examples.

EXAMPLE 1

Heat and corrosion resistant substrates such as nickel electroplated beryllium-copper writing instrument components are ultrasonically degreased in an alkaline cleaning solution, rinsed in deionized water, dried in an organic solvent and mounted onto the substrate carrier of the vacuum system.

The vacuum chamber is evacuated until a pressure of $5\times10^{-3}$ pascals is achieved. Argon is then admitted into the chamber to establish a dynamic pressure of 1.8 pascals and then the substrates are further cleaned by sputter etching by applying to them a negative D.C. potential of 1.5 KV until substantially all of their surface contamination is removed.

To each water-cooled, planar magnetron type target assembly is mounted a sputtering target on its vacuum side and an adjustable magnetic array on its atmosphere side, in close proximity to the sputtering target.

Prior to deposition, contaminants are removed from the targets in the following manner:

A target comprising 98.33 weight percent gold and 1.67 weight percent nickel, at whose surface the maximum transverse component of the magnetic field intensity has been adjusted to about 0.034 tesla, is cleaned of contaminants by rotating the target shutter into position facing the gold alloy target, adjusting the argon flow to establish a dynamic pressure of 0.7 pascals and igniting a constant current glow discharge by applying a negative D.C. potential to the gold alloy target assembly so as to obtain an average power density of about 51 kilowatts per square meter of target area. The discharge is sustained until a substantially constant target voltage is obtained, at which time the electrical power to the target assembly is switched off and the shutter is rotated into position facing the titanium target.

Contaminants are removed from the titanium target in the same manner as described above with the exceptions that the maximum transverse component of the magnetic field intensity is about 0.028 tesla at the surface of the target and the power density is about 66 kilowatts per square meter of target area.

After a substantially constant target voltage is obtained, the titanium target is conditioned to reactive sputtering by admitting a flow of nitrogen gas into the vacuum chamber at a rate which results in a dynamic partial pressure of about $1.7\times10^{-2}$ pascals of nitrogen. This conditioning is continued until a substantially constant target voltage is obtained, at which time deposition is begun.

Whether titanium nitride or the gold alloy is deposited to form the first microlamina is largely a question of which material provides the best adhesion to the substrate material. In this example, titanium nitride is used as the first microlamina material.

In order to produce bright and specular microlaminated films in which the atomic-scale mixing of the microlamina materials is avoided and which have superior color, brilliance, corrosion resistance and mechanical properties, a balance must be struck among the combined applied target powers, substrate bias, substrate rotation rates and gas pressures. An embodiment of the present invention is obtained when: the average power densities for the gold alloy and titanium targets are 3.6 and 66 kilowatts per square meter, respectively; a negative D.C. bias potential of 150 volts is applied to the substrate carrier which is rotated at a constant angular velocity of 0.3 rpm; the dynamic partial pressure of nitrogen is maintained at $5.8\times10^{-2}$ pascals while the dynamic total pressure is maintained at 0.82 pascals with argon; the target to substrate distance is 55 millimeters and the substrates are carried in a circular path which is 570 millimeters in diameter.

These deposition parameters produce individual gold microlaminae which are about 0.007 micrometers thick and about 64 percent opaque which are interlaminated with the individual titanium nitride microlaminae which are about 0.024 micrometers thick and about 69 percent opaque. Rotating the substrates past each target ten times produces a microlaminated film about 0.31 micrometers thick whose ASTM B287 corrosion resistance is equivalent to gold and whose wear resistance is equivalent to about 2.5 micrometers of an electrodeposited gold and nickel alloy of 23.6 karats but contains only about 1/35th gold. The relative service life of films of the present example and of electrodeposited gold alloy coatings has been established by subjecting both types of coated components to the material removal action of abrasive media in a vibratory bowl system of the type commonly used for mass finishing operations.

It is a further feature of the invention that the microlaminated films of the invention possess a resistance to scratching when exposed to conditions of wear and abrasion in the hands of a consumer which far exceed the scratch resistance of conventional metallurgically or electrochemically prepared decorative gold alloys.

Increasing the total number of rotations of the substrate carrier and thereby the final thickness of the microlaminated films of the present example has the effect of increasing the service life of the components thus coated. Microlaminated films about 1.2 micrometers thick have a service life which equals or exceeds that of a gold electroplated coating which is 10 micrometers thick.

The microlaminated films of this example are about 12 karats on the average. Microlaminated films having a different titer are readily obtained by adjusting the ratio of the powers applied to the gold alloy and titanium targets and thus the relative rates at which these materials accumulate at the surface of the substrates. Microlaminated films with mechanical properties far superior to gold electroplated coatings are obtained in the range of 9 to 20 karats.

The color of the titanium nitride can be adjusted to approximate the color of a selected gold or gold alloy by adjusting the flow of nitrogen during the deposition. Generally, most colors of commercial interest can be approximated by titanium nitride in which nitrogen comprises 40 to 50 atomic percent of the compound.

The process according to the invention produces films which have substantially the same color as the gold alloy target and have typically about ninety-three percent of the brilliance of the gold alloy. For many decorative applications this degree of brilliance is adequate, for example, when the coated components are small or have less than specular surface finishes. However, in cases where large, specular components are involved or where components coated with the microlaminated films of the present invention are to be used in juxtaposition with solid gold alloy components or electroplated gold alloy components it may be that substantially equal brilliance as well as substantially equal color is required to obtain a uniform appearance for the fully assembled finished product.

Because the microlaminated films described hereinabove maintain the color and preserve to a large degree the brilliance of the gold alloy of which they are in part comprised, it is a feature of the present invention that they can be made visually equivalent in appearance to the gold alloy in a manner which both conserves the use of gold and retains the superior mechanical properties thus far described. This aspect of the invention and its attendant advantages will be better understood with reference to the next example.

EXAMPLE 2

Heat and corrosion resistant stainless steel or nickel electroplated brass components are degreased and mounted onto the substrate carrier of the vacuum system. The vacuum chamber is then evacuated to a pressure of $5 \times 10^{-3}$ pascals. Thereafter, the components are sputter cleaned and coated using the same procedures employed in Example 1. Upon reaching the final rotation of the microlaminate deposition phase, all deposition parameters are held constant with the exceptions that: the power to the titanium target is switched off; the flow of nitrogen is terminated; the dynamic total chamber pressure is maintained at 0.80 pascals and the substrates are allowed to continue their rotation past the gold alloy target for an additional four rotations at which time the deposition is terminated.

The microlaminated films like those of the first example thereby receive a further coating of the gold alloy which is about 0.020 micrometers thick and which is, by itself, not opaque. The substrates thus coated have an appearance which is visually equivalent in color and brilliance to and have a scratch resistance which far exceeds that of solid gold alloy components or electroplated gold alloy components. For example, cycling the mechanism of button-actuated ball point pens 20,000 times causes actuator buttons electroplated with 2.5 micrometers of a 23.6 karat gold and nickel alloy to develop a cloudy, diffusely reflecting appearance.

Actuator buttons coated with the microlaminated film system of the present example retain their original specular appearance when subjected to the same test.

Non-microlaminated films of the prior art containing the same chemical elements in the same relative abundance as the microlaminated films of the present invention in which the elements are distributed essentially uniformly throughout the film possess a color which is typically twenty to thirty percent less yellow and about thirteen percent less brilliant than the gold alloy target. Such atomically mixed films are less smooth than and have less scratch resistance and corrosion resistance than do microlaminated films of the same average composition.

That the microlaminated films of the present invention are observed to be smoother than atomically mixed films of the same average composition is thought to be due to the fact that at the initial growth stages of each microlamina, nucleation begins anew and the growth of large crystallites is avoided.

X-ray photoelectron spectroscopy (XPS) was used to determine the chemical state of the elements in both the microlaminated films of the present example and films prepared in accordance with the prior art in which the same chemical elements are mixed on an atomic scale. It was observed that the gold $4f_{5/2}$ and $4f_{7/2}$ peaks of the prior art films were shifted by 0.2 electron volts. This indicates that gold atoms exist in a state of chemical bonding and have formed a chemical compound with another of the film's elements. No such shift was observed to occur within the gold-bearing microlaminae of the films of the present example, indicating that those gold atoms remain unaltered and exist in a chemically non-reacted state.

X-ray diffraction analysis was used to detect structural differences which may account for the observed XPS peak shifts of the prior art films.

Pronounced differences were observed between the X-ray diffraction patterns of the microlaminated films of the present example and the atomically mixed prior art films. The most striking difference between the patterns of those two films occurs in the region about the gold (111) peak.

Shown in FIG. 3 are the X-ray diffraction patterns in the region of the gold (111) peak of four different films. Curve 3a is the pattern formed by a film composed entirely of the gold alloy of the present example. Curve 3b is the pattern formed by the gold alloy and titanium nitride microlaminated films of the present example. Curve 3c is the pattern formed by a film comprised of the same elements as in the microlaminated film of curve 3b in which the deposition was performed in accordance with the prior art. Curve 3d is the pattern formed by a film identical to that of curve 3c with the exception that no nitrogen was introduced during the deposition. With reference to curve 3a, it can be seen that the gold alloy film forms with a preferred (111) orientation. It can be seen with reference to curve 3b that the pattern of the microlaminated film strongly resembles the pattern of the gold alloy. It can be seen with reference to curve 3c that this peak of the prior art film is much broader than that of either the gold alloy or microlaminated films. This broadening is due to the presence of compounds which are not detectable in the microlaminated films, whose X-ray diffraction peaks are superposed upon the dominant gold (111) peak. In order to more clearly indicate which titanium-gold compounds occur in the prior art films, the line-broadening effects due to the presence of nitrogen compounds were eliminated by examining a film prepared in accordance with the prior art but in which no nitrogen was incorporated into the film. The pattern of such a film is shown with reference to curve 3d. In this pattern it can be seen that a new peak due to AuTi$_3$ (210) is resolved adjacent to the Au (111) peak.

The evidence provided by the X-ray diffraction and X-ray photoelectron spectroscopy analyses clearly indicate that the degradation of the desirable properties of gold and TiN which is observed to occur in films prepared in accordance with the prior art is due to the unanticipated interaction of these two materials and that the desirable properties of Au and TiN are preserved in the microlaminated films of the present invention because they are produced in a manner that does not promote that interraction.

The evidence provided by the X-ray diffraction and X-ray photoelectron spectroscopy analyses clearly indicate that the degradation of the desirable properties of gold and TiN which is observed to occur in films prepared in accordance with the prior art is due to the unanticipated interaction of these two materials and that the desirable properties of Au and TiN are preserved in the microlaminated films of the present invention because they are produced in a manner that does not promote that interreaction.

Generally, the brilliance and color of the microlaminated films of the present invention are substantially closer to the brilliance and color of the gold or gold alloy than are prior art films in which the atomic-scale mixing of the gold, titanium and nitrogen are not avoided and than are films of primarily titanium nitride. Consequently, if brilliance and color which are visually equivalent to the gold or gold alloy is a required objective for a decorative application, relatively less of a further coating of the gold or gold alloy is required to achieve this objective with the microlaminated films of the present invention and relatively more is required with films of the prior art.

In the case of the prior art films whose color or brilliance is far removed from that of the gold or gold alloy, in order to gain visual equivalence to the gold or gold alloy it is necessary to provide a further gold or gold alloy coating which is by itself opaque or at least nearly opaque in order to occlude the darker or off-color deposit below it. Films of gold alloys like that of Example 1 typically become completely opaque to the transmission of visible light when their thickness reaches 0.13 micrometers.

However, there is an increasing tendency to display scratches which accompanies increasingly thicker gold or gold alloy final coatings applied to consumer products such as jewelry, writing instruments and the like which are exposed to conditions of wear and abrasion. Under such conditions, gold or gold alloy coatings which are 0.13 micrometers thick or thicker become scratched, thereby losing their specular finish and developing a cloudy and diffusely reflecting surface having a lowered visual quality. This scratched appearance generally develops long before the end of a coated articles's useful life is reached.

In contradistinction, because the microlaminated films of the present invention have substantially the same color as the gold or gold alloy and furthermore because their brilliance is typically within seven percent of the gold or gold alloy, it is possible to attain a visual appearance equivalent to the gold alloy with the addition of an extremely thin and non-opaque gold alloy final coating. Components thus coated retain their specular finish and do not develop a cloudy, diffusely reflecting appearance when they are exposed to conditions of wear and abrasion.

Prior art approaches which seek to increase the apparent service life of noble metal coatings by the expedient of underlaying the precious metals with similarly colored, harder materials where there exists an abrupt or graded interface between the two materials are hampered inherently by a linkage between a noble metal appearance and superior scratch resistance.

It is an artifact of the prior art approaches that a noble metal appearance and superior scratch resistance are coupled in an inverse relationship whereby an optimal noble metal appearance is achieved at the expense of scratch resistance or appearance is compromised to attain optimal scratch resistance.

This disadvantageous trade-off of desirable film properties is remedied by the process of the present invention by providing an improved film comprising uniformly interlaminated but unmixed and non-opaque microlaminae of the precious metal alloy and a similarly colored hard material whose separate, decoupled, desirable properties are preserved and contribute the properties of the whole. These microlaminated films may be further coated with an extremely thin precious metal final layer which provides optimal appearance without an accompanying degradation of mechanical properties.

While the present invention has been described in connection with particular embodiments thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed is:

1. A process for coating a thermally resistant substrate with first and second materials selected respectively from a first group consisting of TiN, TaN, ZrN and HfN, and from a second group consisting of Au and an alloy of Au, comprising the first step of depositing on said substrate a non-opaque layer consisting essentially of one of said first or second materials, the second step of depositing on said layer of one of said first or second materials a non-opaque layer consisting essentially of the other of said materials, the third step of depositing on said layer of said other of said materials another non-opaque layer consisting essentially of said one of said first or second materials, and repeating each of said second and third steps at least once, the layers of said first material having a thickness in the range of 0.01 micrometers to 0.33 micrometers, and the layers of said second material having a thickness in the range of 0.003 micrometers to 0.13 micrometers.

2. A process according to claim 1 wherein the additional steps of said second and third steps are repeated at least until said substrate is occluded by a plurality of said layers consisting essentially of said first and second materials.

3. A process according to claim 1 wherein said first material is essentially TiN.

4. A process according to claim 1 wherein said steps of depositing are carried out in a physical vapor deposition process.

5. A process according to claim 4 wherein said physical vapor deposition process is cathodic sputtering.

6. A process according to claim 1 wherein said steps of deposition are carried out using at least two cathode sputtering sources located in a single vacuum chamber and sufficiently separated to preclude mixing of said first and second materials on an atomic scale.

7. A process according to claim 1 comprising the additional step of depositing an outer layer of one or more microlaminae consisting essentially of said second material over said plurality of said layers, said outer layer having a thickness less than 0.13 micrometers.

8. A process according to claim 7 wherein said outer layer has a thickness in the range of from 0.003 micrometers to 0.13 micrometers.

9. An article, comprising
a thermally resistant substrate,
a coating on said substrate of a plurality of pairs of microlaminae respectively consisting essentially of a lamina of a first material and a lamina of a second material,
said first material being selected from the group consisting of TiN, TaN, ZrN and HfN,
said second material being selected from the group consisting of Au, and an alloy of Au, and
each said lamina of said first material having a thickness in the range of 0.01 micrometers to 0.33 micrometers.

10. An article according to claim 8 wherein said lamina of said second material has a thickness no greater than 0.13 micrometers.

11. A process for coating a thermally resistant substrate with first and second layers, one of said layers containing a first material, which is capable of interaction at the atomic level with a second material contained in the other of said layers, comprising
successively and alternately depositing non-opaque first and second layers over one another and over said substrate at least until said substrate is occluded by a plurality of said non-opaque layers,
the thickness of said layers being within the ranges of thickness wherein no interaction occurs between said first and second materials,
whereby the coating does not exhibit the properties of compounds of said first and second materials.

12. A process according to claim 10 wherein said layers are non-opaque and are deposited in a physical deposition process.

13. A process according to claim 11 wherein said physical vapor deposition process is cathodic sputtering.

14. A process according to claim 11, wherein said second material is gold or an alloy of gold.

15. A process according to claim 1, comprising the additional step of depositing an outer layer of one or more laminae of a material which does not react at the atomic level with said first or said second materials.

16. A process according to claim 11 wherein said step of depositing is carried out by using a physical vapor deposition process 17. A process according to claim 16 wherein all of said layers are deposited in a common atmosphere.

18. An article, comprising
a thermally resistant substrate,
a coating on said substrate of a plurality of pairs of non-opaque microlaminae respectively consisting essentially of a microlamina of a first material and a microlamina of a second material,
said first material consisting esentially of a compound of a third material and a fourth material,
said fourth material being incapable of interacting with said second material at the atomic level,
said second material and said third material being capable of interacting at the atomic level, and
the thickness of each said microlamina being within the range of thicknesses wherein no interaction occurs between said second and third materials,
whereby the coating does not exhibit the properties of such interaction.

19. An article according to claim 18 comprising an outer layer of one or more laminae of a material which does not react with said first and second layers at the atomic level.

20. A process for coating a thermally resistant substrate with first and second materials which are capable of interaction at the atomic level, comprising
using a physical vapor deposition process to successively and alternately deposit non-opaque layers respectively including said first and second materials over one another and over said substrate, and
said physical vapor deposition process being carried out continuously in a gaseous atmosphere which is capable of interaction at the atomic level with said first material and incapable of interaction at the atomic level with said second material, said process being continued at least until said substrate is occluded by a plurality of said non-opaque layers.

21. A process according to claim 20 wherein said first material is selected from the group consisting of Ti, Ta, Zr and Hf,
said second material is selected from the group consisting of Au and an alloy of Au,
said gaseous atmosphere includes nitrogen, and
said physical vapor deposition process utilizes cathode sputtering.

* * * * *